United States Patent [19]

Palmer et al.

[11] Patent Number: 5,352,725
[45] Date of Patent: Oct. 4, 1994

[54] ATTENUATION OF POLYMER SUBSTRATE DEGRADATION DUE TO ULTRAVIOLET RADIATION

[75] Inventors: Bruce R. Palmer; James W. Kauffman, both of Edmond, Okla.; Penelope Stamatakis, Aurora, Ill.

[73] Assignee: Kerr-McGee Chemical Corporation, Oklahoma City, Okla.

[21] Appl. No.: 942,486

[22] Filed: Sep. 9, 1992

Related U.S. Application Data

[63] Continuation of Ser. No. 766,936, Sep. 27, 1991, abandoned.

[51] Int. Cl.⁵ .................... C08K 3/18; C08K 3/22; H01B 1/06; H01B 1/02
[52] U.S. Cl. .................... 524/432; 524/497; 252/507; 252/511; 252/512
[58] Field of Search .......... 524/432, 497, 420; 252/511, 507, 512

[56] References Cited

U.S. PATENT DOCUMENTS

| | | | |
|---|---|---|---|
| 3,890,268 | 6/1975 | Tanzilli | 524/497 |
| 3,907,581 | 9/1975 | Willcox | 524/497 |
| 4,073,764 | 2/1978 | Hemmerich et al. | 524/497 |
| 4,877,819 | 10/1989 | Kiyohara et al. | 524/497 |
| 4,896,946 | 1/1991 | Parish | 252/511 |
| 5,066,422 | 11/1991 | Felter et al. | 252/507 |

FOREIGN PATENT DOCUMENTS

| | | | |
|---|---|---|---|
| 0158630 | 12/1975 | Japan. | |
| 3278959 | 11/1988 | Japan | 524/420 |

OTHER PUBLICATIONS

"Introduction to Ceramics", W. D. Kingery et al., John Wiley & Sons, New York, 1976 pp. 847–851 and 866–868.
"Testing UVA and UVB Protection From Microfine Titanium Dioxide", M. W. Brown and E. Galley, *Cosmetics & Toiletries*, Allured Publishing Corporation, Wheaton, Ill., pp. 69–73 (Dec., 1990).
"Optimum Particle Size of Titanium Dioxide and Zinc Oxide for Attenuation of Ultraviolet Radiation", P. Stamatakis, B. R. Palmer, G. C. Salzman, C. F. Bohren and T. B. Allen, *Journal of Coatings Technology*, Federation of Societies for Coatings Technology, Philadelphia, Penn., vol. 62, No. 789, pp. 95–98 (Oct., 1990).
Chemical Abstract 114 (22), 209983q (1991).
Chemical Abstract 114 (16), 145531f (1990).
Chemical Abstract 113 (8), 68119c (1990).
Chemical Abstract 112 (12), 104587u (1989).
Chemical Abstract 112 (10), 79754m, (1989).
Chemical Abstract 112 (6), 42254x (1989).
Chemical Abstract 109 (18), 160695c (1988).
Chemical Abstract 109 (16), 134842d (1988).
Chemical Abstract 107 (22), 204939a (1987).
Chemical Abstract 106 (6), 38239e (1986).
Chemical Abstract 99 (6), 43323u (1983).
Chemical Abstract 114 (20), 187663f (1991).

*Primary Examiner*—Paul R. Michl
*Assistant Examiner*—LaVonda DeWitt
*Attorney, Agent, or Firm*—Herbert M. Hanegan

[57] ABSTRACT

Improved methods and polymer compositions are provided whereby ultraviolet radiation degradation of substrates formed of the compositions is attenuated. In accordance with the invention, ultraviolet scattering and absorbing particles having a particle size in the range of from about 0.001 micrometer to about 0.20 micrometer in diameter are dispersed in at least a surface layer of a polymer substrate.

8 Claims, 3 Drawing Sheets

ATTENUATION OF POLYMER SUBSTRATE DEGRADATION DUE TO ULTRAVIOLET RADIATION

This application is a continuation of patent application Ser. No. 07/766,936, filed Sep. 27, 1991 now abandoned.

BACKGROUND OF THE INVENTION

1. Field of the Invention

The present invention relates to improved methods and polymer compositions wherein degradation due to ultraviolet radiation is attenuated.

2. Description of the Prior Art

Metal oxide particles, e.g., titanium dioxide and zinc oxide particles, have heretofore been dispersed in polymer substrates for the purpose of minimizing ultraviolet radiation degradation of the substrates. The metal oxide particles either scatter or absorb harmful ultraviolet radiation thereby reducing damage to the polymer substrate. An example of a plastic product which has included titanium dioxide particles is polyvinyl chloride siding used in the construction or renovation of buildings and homes.

While the above described metal oxide particles dispersed in polymer substrates have functioned to reduce ultraviolet radiation degradation, the particles have generally been relatively large, i.e., approximately 0.2 micrometer in diameter and larger, and consequently they have not achieved maximum attenuation of the damaging effects of ultraviolet radiation.

Another desirable property of particles used for reducing ultraviolet radiation degradation is low opacity in the visible portion of the spectrum. This property is required so that the particles do not mask colored pigments which are added to paints and plastics. If the particles used for reducing ultraviolet radiation have such low opacity, lower quantities of the expensive colored pigments used in colored products or less expensive colored pigments with low tinting strengths can be used. As stated above, the metal oxide particles used heretofore have generally been relatively large and have not provided the minimum opacity possible.

By the present invention improved methods and polymer compositions containing ultraviolet attenuating particles are provided whereby ultraviolet radiation degradation is reduced to a minimum and relatively low particle opacity in the visible part of the spectrum is attained.

SUMMARY OF THE INVENTION

Improved methods of reducing the ultraviolet radiation degradation of polymer substrates are provided. In accordance with the methods, ultraviolet light scattering and absorbing particles having relatively low opacity in the visible part of the spectrum are dispersed in at least a surface layer of a polymer substrate to attenuate ultraviolet radiation degradation. The particles are formed of a material having a band gap in the range of from about 2.8 electron volts (eV) to about 4.1 eV, such as rutile, anatase or amorphous titanium dioxide or wurtzite or amorphous zinc oxide, and are of a size in the range of from about 0.001 micrometer to about 0.2 micrometer in diameter, more preferably from about 0.01 to about 0.15 micrometer. The loading of the particles is generally in the range of from about 0.1% to about 30% particles by weight of the polymer substrate layer and particles contained therein, more preferably from about 1% to about 15% by weight.

Polymer compositions containing ultraviolet attenuating particles of relatively low opacity whereby the compositions have reduced susceptibility to degradation as a result of ultraviolet radiation, and in which less colored pigment or less expensive colored pigment can often be utilized, are also provided.

It is, therefore, a general object of the present invention to provide improved methods and polymer compositions containing ultraviolet attenuating particles whereby degradation due to ultraviolet radiation is reduced and the particles are of relatively low opacity.

Other and further objects, features and advantages of the present invention will be readily apparent to those skilled in the art upon a reading of the description of preferred embodiments which follows when taken in conjunction with the accompanying drawings.

DESCRIPTION OF PREFERRED EMBODIMENTS

Figure 1:
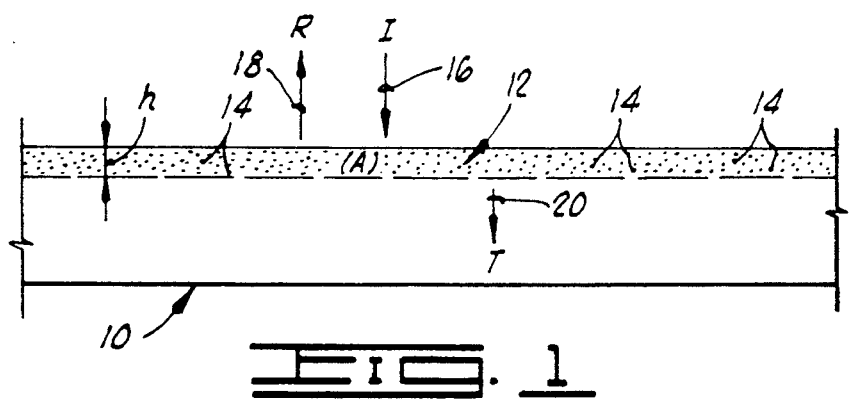
FIG. 1 is a schematic illustration of a polymer substrate having particles dispersed in a surface layer thereof in accordance with the present invention.

In accordance with the improved methods of the present invention, the ultraviolet radiation degradation of a polymer substrate is reduced by dispersing ultraviolet scattering and absorbing particles in at least a surface layer of the polymer substrate, the particles being of a size in the range of from about 0.001 micrometer to about 0.20 micrometer in diameter, more preferably from about 0.01 to about 0.15 micrometer in diameter.

The polymer substrates in which the sized particles of this invention can be included to reduce ultraviolet radiation degradation are paints, coatings, plastic articles and the like. Typically the polymer substrates are comprised of any of the well-known resin materials such as polyolefin, polyvinylaromatic, acrylic, polycarbonate, polyester, polyamide, epoxy and polyvinylhalide resins. Representative, but nonlimiting examples of specific polymeric resin materials include polyolefin resins such as polyethylene and polypropylene, polyvinylhalide resins such as poly(vinyl chloride) and poly(vinyl chloride) copolymers, polyvinylaromatic resins such as polystyrene and polystyrene copolymers, and acrylic resins such as poly(methyl acrylate). A variety of diluents and additives which are well known to those skilled in the art are usually admixed with the polymer resins including, but not limited to, water, oils, fillers, reinforcement materials, coupling agents and the like.

The present invention is particularly useful in paints, coatings and plastic articles which are subjected to solar radiation, i.e., are utilized outdoors.

The ultraviolet light scattering and absorbing particles which are useful in accordance with this invention are particles formed of a material having a band gap within the range of from about 2.8 eV to about 4.1 eV, and having a size in the range of from about 0.001 micrometer to about 0.20 micrometer in diameter. Particularly suitable such particles are formed of metal oxides such as rutile, anatase or amorphous titanium dioxide having band gaps of about 3.0 eV, wurtzite or amorphous zinc oxide also having band gaps of about 3.0 eV and mixtures thereof. Preferably, the particles are selected from the group consisting of rutile, anatase, and amorphous titanium dioxide particles, wurtzite and amorphous zinc oxide particles and mixtures thereof, the particles being of a size in the range of from about 0.01 micrometer to about 0.15 micrometer in diameter. Such particles, in addition to providing greater reduction of polymer substrate degradation due to ultraviolet radiation than the particles used heretofore, as a result of being smaller provide a lower opacity in the visible part of the spectrum which reduces the quantities or strengths of the colored pigments required to produce colored products containing the particles.

The above described particles can be dispersed throughout a polymer substrate to thereby scatter and absorb ultraviolet radiation, or the particles can be dispersed in a surface layer of the polymer substrate whereby ultraviolet radiation is substantially scattered and absorbed in the layer prior to being transmitted to the underlying polymer substrate. The particle loading of the polymer substrate or layer thereof is preferably within the range of from about 0.1% to about 30% particles by weight of the polymer substrate or layer and the particles contained therein.

When titanium dioxide and/or zinc oxide particles are utilized in accordance with the method of this invention, the particles have diameters in the range of from about 0.001 micrometer to about 0.20 micrometer, more preferably from about 0.01 to about 0.15 micrometer, and are dispersed in the polymer substrate or layer thereof at a loading in the range of from about 0.1% to about 30% by weight, more preferably from about 1% to about 15% by weight.

A polymer composition of this invention which has reduced susceptibility to degradation as a result of ultraviolet radiation comprises a polymer resin having ultraviolet scattering and absorbing particles dispersed therein. The particles are formed of a material having a band gap in the range of from about 2.8 eV to about 4.1 eV and are of a size in the range of from about 0.001 micrometer to about 0.20 micrometer, more preferably from about 0.01 micrometer to about 0.15 micrometer. Preferred such particles are formed of rutile, anatase or amorphous titanium dioxide, wurtzite or amorphous zinc oxide and mixtures thereof.

The polymer resin can be any resin suitable for use in paints, coatings or articles which are exposed to solar radiation. Generally, the polymer substrates can be comprised of any of a great variety of resin materials. Examples are polyolefin, polyvinylaromatic, acrylic, polycarbonate, polyester, polyamide, epoxy and polyvinylhalide resins.

In order to illustrate the beneficial effects of the present invention, the transmittance, reflectance and absorptance of ultraviolet radiation by particles formed of materials and sized in accordance with the invention dispersed in a polymer layer were calculated. As mentioned above, the particle bearing layer protects the underlying polymer substrate from an ultraviolet radiation source such as sunlight, and prevents or substantially reduces ultraviolet radiation degradation damage thereto. The interaction of ultraviolet radiation with the scattering and absorbing particles was modeled using an expression for the two-stream theory presented by C. F. Bohren in his paper "Multiple Scattering of Light and Some of its Observable Consequences," *Am. J. Phys.*, 55(6), 524 (1987). The interaction assumed for the calculations is illustrated in FIG. 1 wherein a polymer substrate 10 is shown having a surface layer 12 containing the scattering and absorbing particles 14 of this invention. Incident ultraviolet radiation is represented in FIG. 1 by the letter I and the arrow 16. The reflectance of the ultraviolet radiation is indicated by the letter R and the arrow 18, the transmittance of ultraviolet radiation through the layer 12 is indicated by the letter T and the arrow 20 and the absorptance of ultraviolet radiation by the particles 14 within the layer 12 is indicated by the letter A.

The reflectance R and transmittance T of the polymer substrate layer 12 are calculated from the complex refractive index of the particles 14, their size, and the wavelength of the ultraviolet radiation, I. Four quantities are required for these calculations, namely, the single-scattering albedo, $\omega_o$; the reflectance of an infinitely thick layer of particles, $R_\infty$; the optical thickness, $\hat{\tau}$; and the dimensionless attenuation coefficient, k. Also, as illustrated by the relationships which follow, the reflectance R and transmittance T are calculated from the scattering efficiency, $Q_{sca}$; the extinction efficiency, $Q_{ext}$; and asymmetry parameter, g, for the particles 14 using Mie theory.

The reflectance of an infinitely thick layer of particles, $R_\infty$, is calculated in accordance with the following relationship, $$R_\infty = \frac{\sqrt{1 - \omega_o g} - \sqrt{1 - \omega_o}}{\sqrt{1 - \omega_o g} + \sqrt{1 - \omega_o}}$$

where the single-scattering albedo $\omega_o$ is defined as, $$\omega_o = \frac{Q_{sca}}{Q_{ext}}$$

The reflectance R and transmittance T are $$R = \frac{R_\infty(1 - e^{-2k\hat{\tau}})}{1 - R_\infty^2 e^{-2k\hat{\tau}}}$$

and

-continued $$T = \frac{(1 - R_\infty^2)e^{-2k\tau}}{1 - R_\infty^2 e^{-2k\tau}}$$

where the optical thickness is $$\tau = \frac{3fh \, Q_{ext}}{4r}$$

The particle 14 radius is denoted by r, f is the particle 14 volume fraction in the layer 12 and h is the thickness of the layer 12.

The dimensionless attenuation coefficient in the equations for R and T is $$k = \sqrt{(1 - \omega_0 g)(1 - \omega_0)}$$

Finally, the absorptance A is determined from an energy balance as shown by, $$A = 1 - (R + T)$$

The quantity fh is the particle loading in layer 12 expressed as volume of solid per unit area of surface of the layer. The mass loading is determined by multiplying fh by the density of the particles. The mass loading is expressed as mass per unit area of layer 12 surface, i.e., milligrams per square meter ($mg/m^2$).

The complex refractive indices of rutile titanium dioxide and wurtzite zinc oxide used in the calculations were obtained from Ribarsky, M. W., *Titanium Dioxide ($TiO_2$-rutile)*: Handbook of Optical Constants of Solids, Palik, E. W. (Ed.), Academic Press, New York, N.Y., 795-804 (1985) and Burgiel, J. C., Chen, Y. S., Vratny, F., and Smolinsky, G., "Refractive Indices of Zinc Oxide, Zinc Sulfide, and Several Thin-Film Insulators," *J. Electrochem. Soc.*, 115, 729-732 (1968), respectively. All calculations were performed for monosize spherical particles, and scattering was calculated as a function of particle diameter and wavelength of the incident ultraviolet radiation. The refractive index of the polymer used in the calculations was 1.55.

The most favorable conditions for reducing damage to the polymer substrate by ultraviolet radiation are those which minimize the transmittance of ultraviolet radiation. This principle was used to identify the optimum conditions for attenuation of ultraviolet radiation in the calculations.

Figure 2:
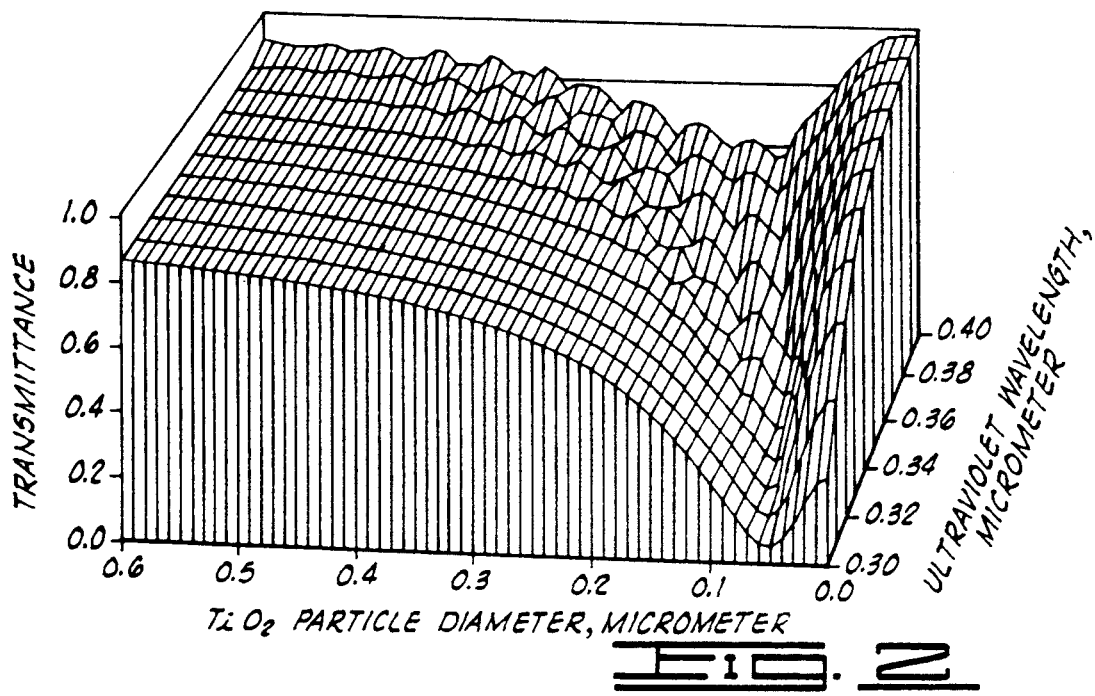
FIG. 2 is a three-dimensional graph illustrating the transmittance of a polymer substrate layer containing rutile titanium dioxide particles as a function of particle size and wavelength of ultraviolet radiation.

The computational results obtained for rutile titanium dioxide transmittance are given in FIG. 2. FIG. 2 shows the fraction of the incident ultraviolet radiation, I, transmitted by the protective layer 12 on the surface of the polymer substrate 10 (FIG. 1). The transmittance is shown as a function of particle diameter and wavelength. The wavelength of radiation used in the calculations ranges from 0.3 to 0.4 micrometer which corresponds to solar ultraviolet radiation.

As shown in FIG. 2, the particle diameter that provides the greatest attenuation depends on the wavelength of the incident ultraviolet radiation. This diameter varies from 0.05 micrometer for 0.30-micrometer radiation to 0.12 micrometer for 0.4-micrometer radiation. At the optimum particle size, the incident ultraviolet radiation is attenuated effectively. That is, the transmittance of 0.3-micrometer radiation is only 5% for a 0.05-micrometer particle.

Figure 3:
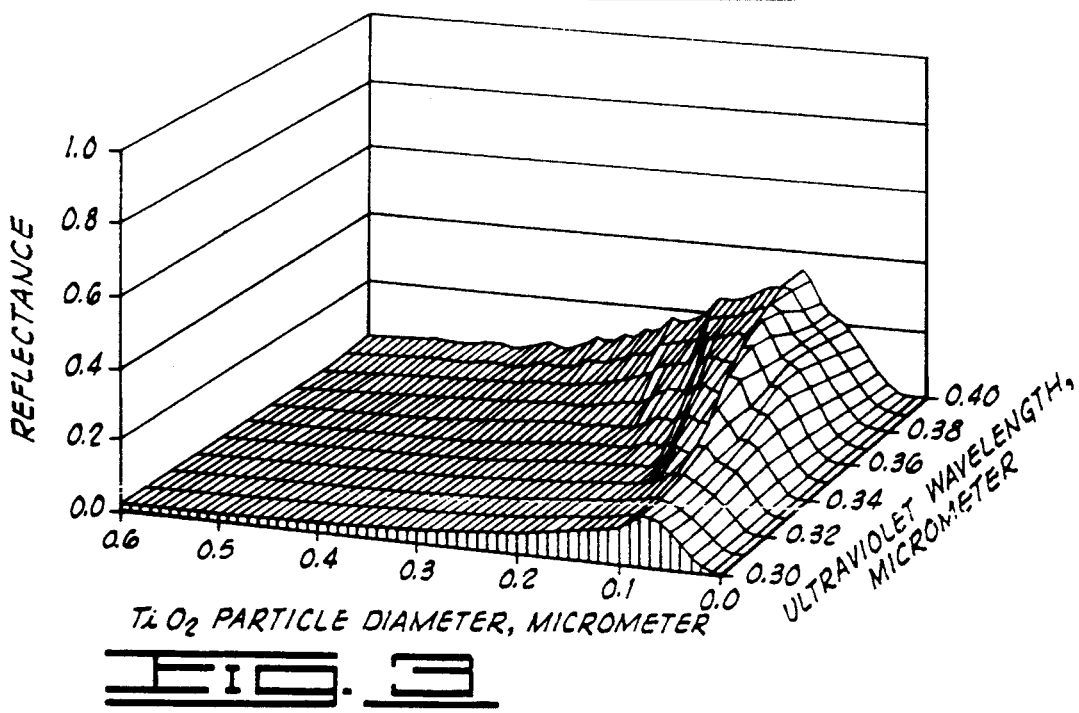
FIG. 3 is a three-dimensional graph illustrating the reflectance of a polymer substrate layer containing rutile titanium dioxide particles as a function of particle size and wavelength of ultraviolet radiation.

The importance of scattering can be assessed by considering the reflectance of the particle-loaded polymer layer. FIG. 3 shows the reflectance of the layer as a function of particle diameter and wavelength. Reflectance is greatest for optimum-size particles at the long wavelength end of the UV spectrum, indicating that scattering is an important mechanism for attenuation of ultraviolet radiation at such wavelengths.

Figure 4:
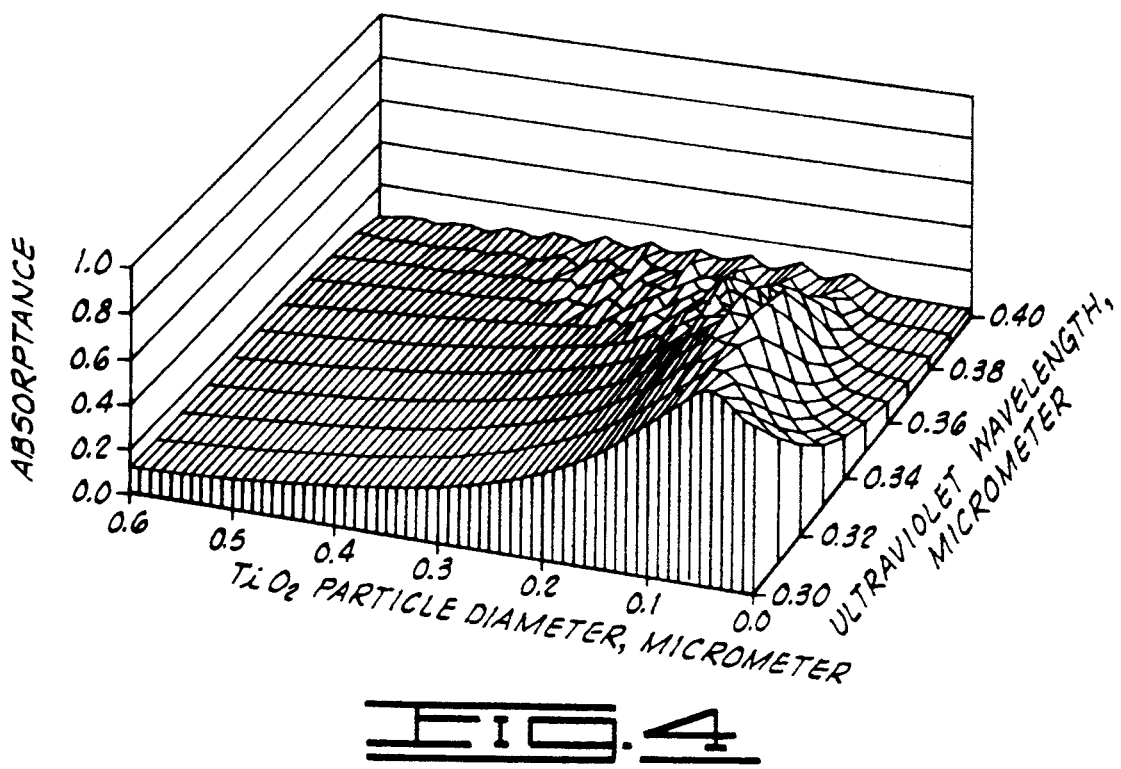
FIG. 4 is a three-dimensional graph illustrating the absorptance in a polymer substrate layer containing rutile titanium dioxide particles as a function of particle size and wavelength of ultraviolet radiation.

As shown in FIG. 4, absorption is more important at short wavelengths. That is, FIG. 4 shows the absorptance of a polymer substrate layer containing rutile titanium dioxide particles as a function of incident radiation wavelength and particle diameter. For titanium dioxide, both scattering and absorption are important in attenuating ultraviolet radiation in polymer substrate layers, each mechanism predominating at different ends of the solar ultraviolet spectrum.

The product of film thickness and titanium dioxide loading, fh, was chosen to be 0.05 micrometer. This value provides sufficient transmittance of ultraviolet radiation so that the performance of the titanium dioxide particles could be compared readily across a large range of size and wavelength. This value of fh corresponds to a titanium dioxide loading of 210 $mg/m^2$. In terms of the thickness of the layer 12, this fh value corresponds to a one micrometer thick layer containing five volume percent titanium dioxide particles.

Figure 5:
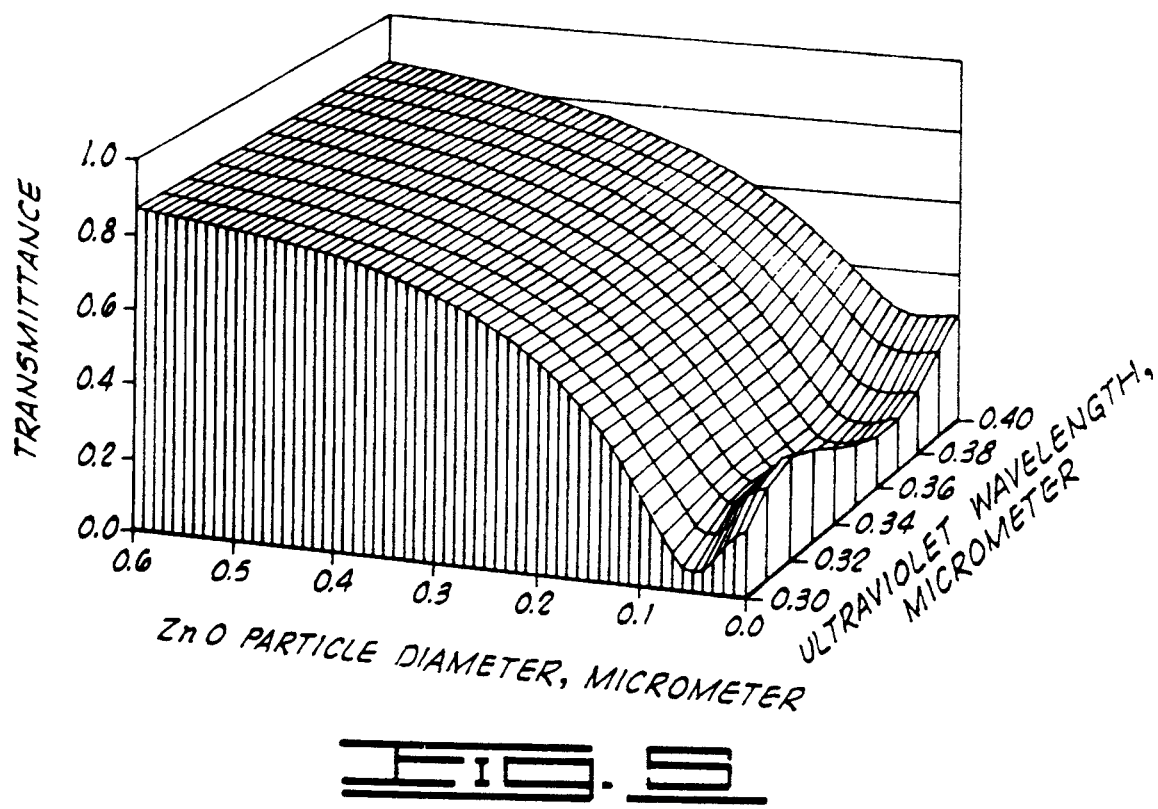
FIG. 5 is a three-dimensional graph illustrating the transmittance of a polymer substrate layer containing wurtzite zinc oxide particles as a function of particle size and wavelength of ultraviolet radiation.
Figure 6:
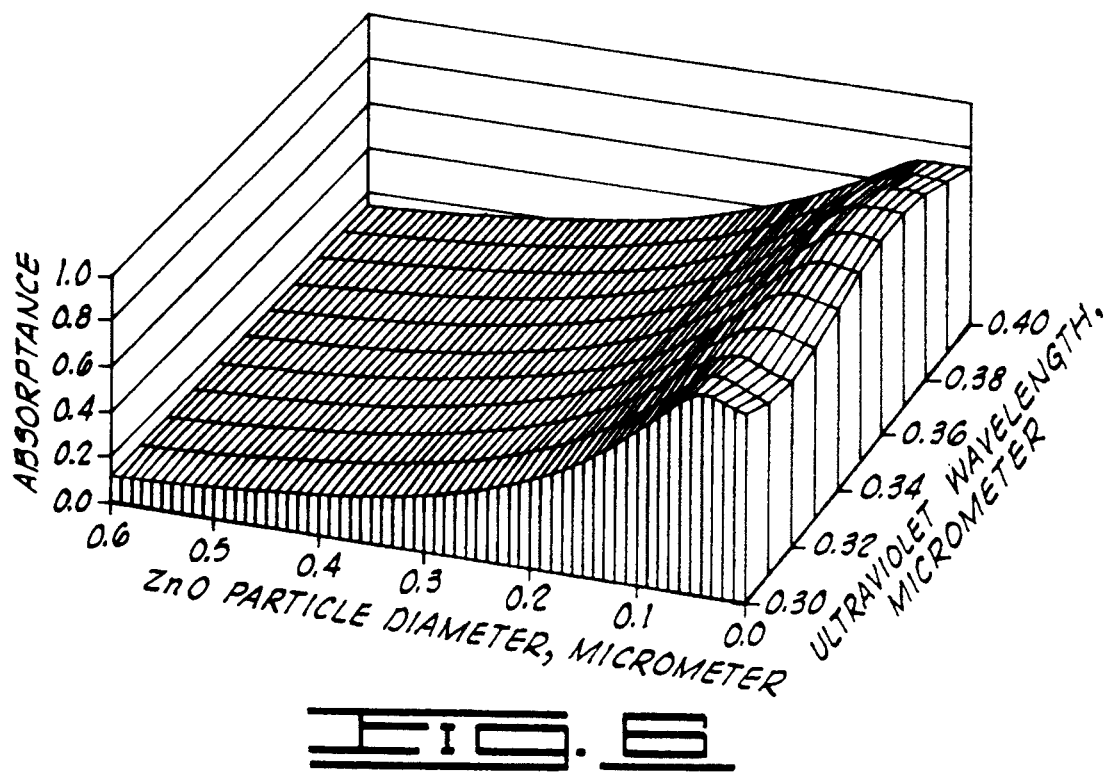
FIG. 6 is a three-dimensional graph illustrating the absorptance in a polymer substrate layer containing wurtzite zinc oxide particles as a function of particle size and wavelength of ultraviolet radiation.
Figure 7:
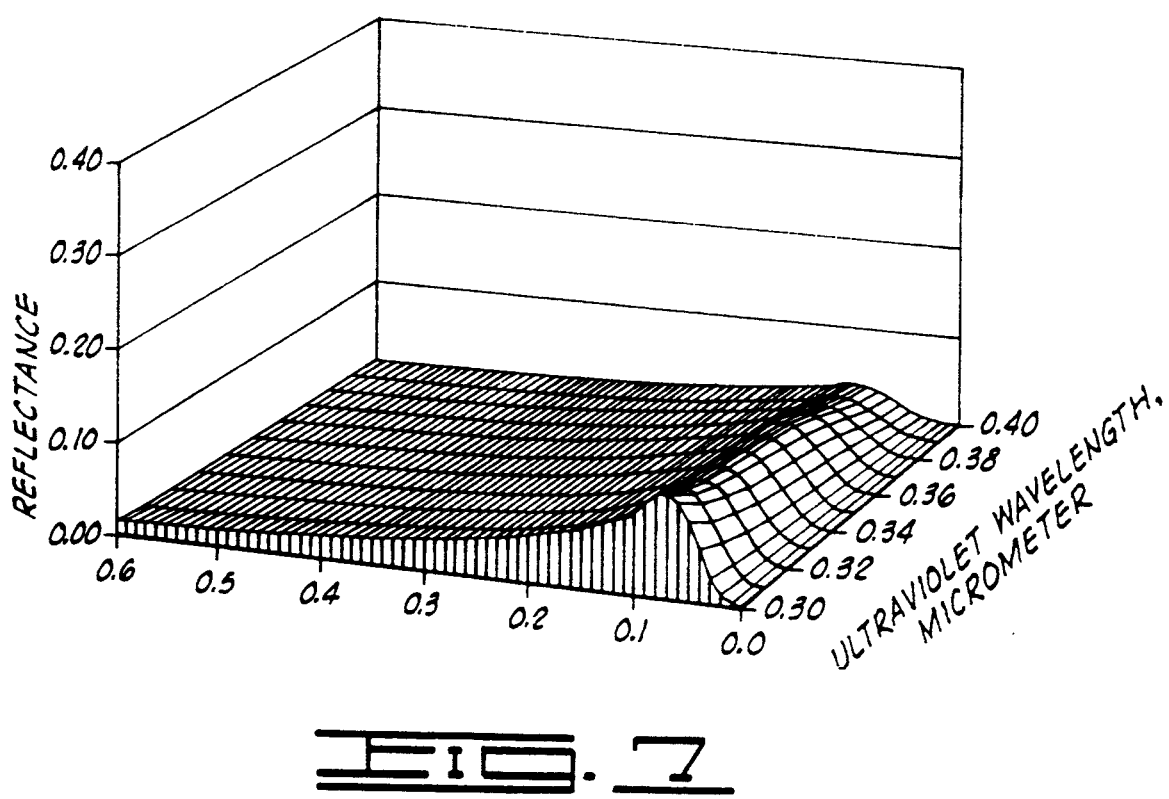
FIG. 7 is a three-dimensional graph illustrating the reflectance of a polymer substrate layer containing wurtzite zinc oxide particles as a function of particle size and wavelength of ultraviolet radiation.

Referring now to FIG. 5, the transmittance for a wurtzite zinc oxide particle containing layer with an fh of 0.05 micrometer corresponding to a loading of 280 $mg/m^2$ is illustrated as a function of particle diameter and wavelength. The transmittance of ultraviolet radiation by a polymer substrate layer containing zinc oxide particles is different from a polymer substrate layer containing titanium dioxide particles. As illustrated by FIG. 5, small zinc oxide particles provide the highest attenuation, and the effectiveness of the particles declines rapidly as size increases. Since the real portion of the refractive index of wurtzite zinc oxide is smaller than that for rutile titanium dioxide, absorption plays a more important role for zinc oxide in attenuation of ultraviolet radiation than does scattering. This is consistent with the information shown in FIGS. 6 and 7 which illustrate the absorptance and reflectance, respectively, of zinc oxide as a function of particle size and wavelength. Comparison of the data in FIGS. 6 and 7 indicates that absorption predominates over the range of particle sizes and wavelengths considered.

In accordance with the present invention, the operable size of spherical particles of rutile, anatase or amorphous titanium dioxide, wurtzite or amorphous zinc oxide, or other materials of similar band gap for attenuating ultraviolet radiation is a diameter in the range of from about 0.001 micrometer to about 0.20 micrometer. As shown by the calculation results for rutile titanium dioxide particles, the optimum size is in the range of from about 0.05 to about 0.12 micrometer over the wavelength range of from about 0.3 to about 0.4 micrometer. When titanium dioxide spherical particles are utilized, scattering plays an important role in the attenuation of ultraviolet radiation at long ultraviolet wavelengths and absorption plays an important role at short ultraviolet wavelengths.

For wurtzite zinc oxide particles, the optimum size for attenuation of ultraviolet radiation is in the range of from about 0.05 micrometer to about 0.06 micrometer for the wavelength range of from about 0.3 to about 0.4 micrometer. Absorption is the dominant mechanism for attenuation of ultraviolet radiation by zinc oxide particles in polymer substrates in the aforementioned ultraviolet wavelength range.

While monosized particles are generally preferred for use in accordance with this invention, particles of varying diameter can also be utilized provided that the diameters of the particles in the distribution are within the broad range of diameters given herein, i.e., from about 0.001 micrometer to about 0.20 micrometer and at least 50% by weight of the total particles used are in the size range of from about 0.01 micrometer to about 0.15 micrometer in diameter.

Thus, the present invention is well adapted to carry out the objects and attain the ends and advantages mentioned as well as those which are inherent therein. While changes in the invention may be able to be made by those skilled in the art, such changes are encompassed within the spirit of this invention as defined by the appended claims.

What is claimed is:

1. A method of reducing the ultraviolet radiation degradation of a polymer substrate comprising dispersing ultraviolet scattering and absorbing particles in at least a surface layer of said polymer substrate, said particles being formed of a material having a band gap in the range of from about 2.8 eV to about 4.1 eV, being of a size in the range of from about 0.001 micrometer to about 0.20 micrometer in diameter and having low opacity in the visible radiation region of the spectrum wherein the loading of said particles in said surface layer is in the range of from about 1% to about 15% by weight of said layer and particles contained therein and wherein said particles are selected from the group consisting of rutile anatase and amorphous titanium dioxide particles, wurtzite and amorphous zinc oxide particles and mixtures thereof.

2. The method of claim 1 wherein said particles are rutile titanium dioxide particles having a size in the range of from about 0.05 to about 0.12 micrometer and optimally attenuate ultraviolet radiation having a wavelength in the wavelength range of from about 0.3 micrometer to about 0.4 micrometer.

3. The method of claim 1 wherein said particles are wurtzite zinc oxide particles having a size in the range of from about 0.05 micrometer to about 0.06 micrometer and optimally attenuate ultraviolet radiation having a wavelength in the wavelength range of from about 0.3 to about 0.4 micrometer.

4. The method of claim 1 wherein said particles are combined with a colored pigment and said particles do not mask said colored pigment.

5. A polymer composition having reduced susceptibility to degradation as a result of ultraviolet radiation comprising a polymer resin having ultraviolet scattering and absorbing particles dispersed therein, said particles being formed of a material having a band gap in the range of from about 2.8 eV to about 4.1 eV, being of a size in the range of from about 0.001 micrometer to about 0.20 micrometer in diameter and having low opacity in the visible radiation region of the spectrum wherein the loading of said particles in said composition is in the range of from about 1% to about 15% by weight of said composition and wherein said particles are selected from the group consisting of rutile anatase and amorphous titanium dioxide particles, wurtzite and amorphous zinc oxide particles and mixtures thereof.

6. The polymer composition of claim 5 wherein said particles are rutile titanium dioxide particles having a size in the range of from about 0.05 to about 0.12 micrometer and optimally attenuate ultraviolet radiation having a wavelength in the wavelength range of from about 0.3 to about 0.4 micrometer.

7. The polymer composition of claim 5 wherein said particles are wurtzite zinc oxide particles having a size in the range of from about 0.05 to about 0.06 micrometer and optimally attenuate ultraviolet radiation having a wavelength in the wavelength range of from about 0.3 to about 0.4 micrometer.

8. The polymer composition of claim 5 further including a colored pigment and wherein said particles do not mask said colored pigment.

* * * * *

UNITED STATES PATENT AND TRADEMARK OFFICE
CERTIFICATE OF CORRECTION

PATENT NO. : 5,352,725
DATED : October 4, 1994
INVENTOR(S) : Bruce R. Palmer, James W. Kauffman, and Penelope Stamatakis It is certified that error appears in the above-indentified patent and that said Letters Patent is hereby corrected as shown below:

Column 7, line 35, delete "rutile" between "of" and "anatase"

Column 8, line 24, delete "rutile" between "of" and "anatase"

Signed and Sealed this

Sixth Day of January, 1998

Attest:

BRUCE LEHMAN

Attesting Officer     Commissioner of Patents and Trademarks